(12) United States Patent
Allman et al.

(10) Patent No.: US 6,972,217 B1
(45) Date of Patent: Dec. 6, 2005

(54) LOW K POLYMER E-BEAM PRINTABLE MECHANICAL SUPPORT

(75) Inventors: Derryl J. Allman, Camas, WA (US); Charles May, Gresham, OR (US)

(73) Assignee: LSI Logic Corporation, Milpitas, CA (US)

(*) Notice: Subject to any disclaimer, the term of this patent is extended or adjusted under 35 U.S.C. 154(b) by 64 days.

(21) Appl. No.: 10/328,614

(22) Filed: Dec. 23, 2002

(51) Int. Cl.⁷ .............................................. H01L 21/82
(52) U.S. Cl. .................... 438/130; 438/618; 438/623; 438/624; 438/631; 438/633; 438/778; 438/781
(58) Field of Search .................... 438/130, 624, 438/778, 618, 623, 631, 633, 781

(56) References Cited

U.S. PATENT DOCUMENTS

| | | | |
|---|---|---|---|
| 6,077,764 A * | 6/2000 | Sugiarto et al. | 438/597 |
| 6,080,526 A * | 6/2000 | Yang et al. | 430/296 |
| 6,245,663 B1 * | 6/2001 | Zhao et al. | 438/622 |
| 2003/0087191 A1 * | 5/2003 | Lavallee et al. | 430/296 |
| 2004/0048960 A1 * | 3/2004 | Peterson et al. | 524/261 |
| 2004/0058277 A1 * | 3/2004 | He et al. | 430/296 |

* cited by examiner

*Primary Examiner*—George Fourson
*Assistant Examiner*—Thanh V. Pham
(74) *Attorney, Agent, or Firm*—Beyer Weaver & Thomas, LLP

(57) ABSTRACT

A low-k interconnect dielectric layer is strengthened by forming pillars of hardened material in the low-k film. An E-beam source is used to expose a plurality of pillar locations. The locations are exposed with a predetermined power and exposure time to convert the low-k film in the selected locations to pillars having higher hardness and strength than the surrounding portions of the low-k film.

21 Claims, 2 Drawing Sheets

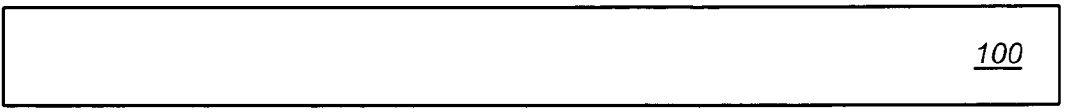
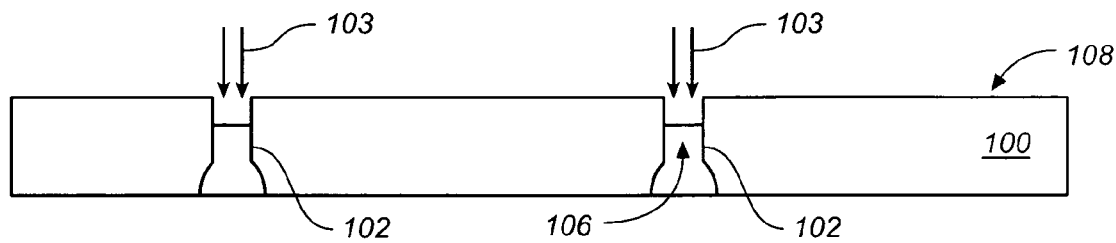
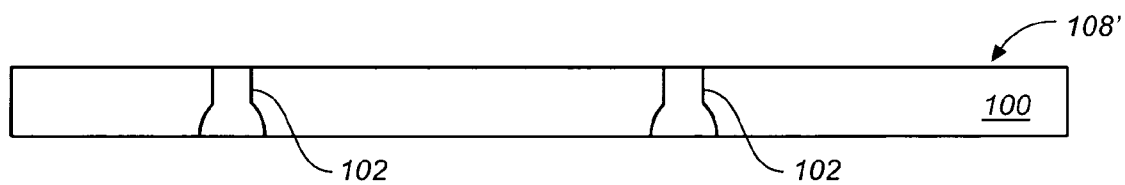
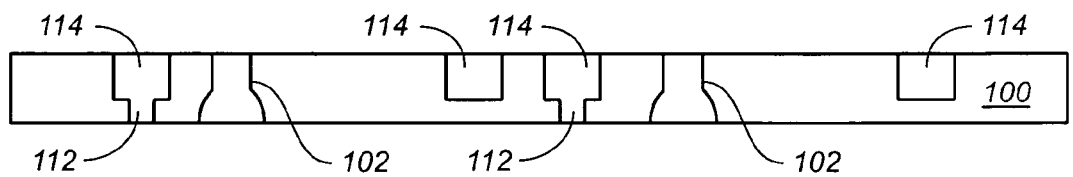
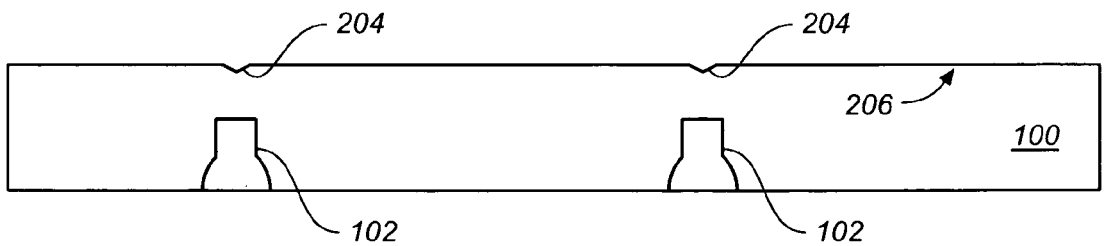
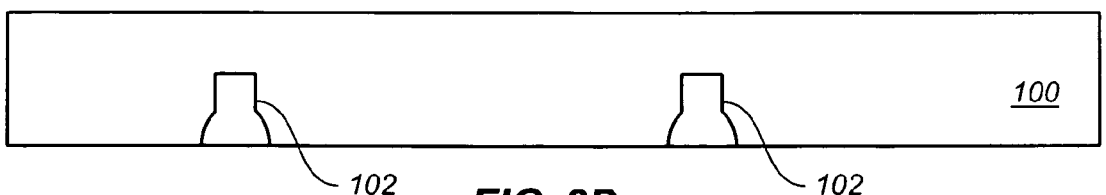

LOW K POLYMER E-BEAM PRINTABLE MECHANICAL SUPPORT

BACKGROUND OF THE INVENTION

1. Field of the Invention

The present invention relates to dielectric materials used in semiconductor integrated circuits. More particularly, the present invention relates to improvements in the mechanical strength of low-k layers used as dielectric layers in semiconductor integrated circuits.

2. Description of the Related Art

As integrated circuits become smaller, it becomes more desirable to reduce interconnection delays through the selection of materials used in the interconnects and associated dielectric layers. The propagation delays through the interconnects are proportional to the resistance of the interconnects and the capacitance offered by the dielectric. In fact, as integrated devices become smaller, the RC-delay time of signal propagation along interconnects becomes the dominant factor limiting overall chip speed.

For conductors, copper has gained favor in the industry because of its many advantages, including its low resistance. In such processes, conducting metal (e.g., copper) is inlaid into trench and via structures of insulating material (e.g., low-K dielectric materials). CMP (Chemical Mechanical Polishing) is used to remove conducting metal (e.g., copper) in single or dual damascene processes. With the advent of copper technology, R has been minimized and attention has been focused on reducing C.

One way of reducing capacitance is to reduce the average dielectric constant k of the thin insulating films surrounding interconnects through the introduction of porosity. The dielectric layers in conventional integrated circuits have traditionally been formed of $SiO_2$, which has a dielectric constant of about 4.0. A number of dielectric materials have been developed having a dielectric constant lower than that of $SiO_2$. These are generally referred to as low-k materials.

But low-k materials used in interconnect dielectrics exhibit low mechanical strength. That is, the lack of mechanical rigidity of the composite low-k and metal interconnect materials causes delamination of the low-k to low-k layers when shear forces are applied. The mechanical strength of low-k films has been reported to be 5 times less than that of traditional silicon dioxide. Integrated circuits are often made up of thousands of active devices formed in or on silicon substrates. The active devices are interconnected to form functional circuits and components through the use of well-known multilevel interconnections. Interconnection structures normally have a first layer of metallization, an interconnection layer, a second level of metallization, and sometimes a third or other subsequent levels of metallization. The low-k dielectric materials are used to electrically isolate the different levels of metallization in a silicon substrate or well. The electrical connections between different interconnection levels are made through the use of metallized vias. Thus, a semiconductor device may include several low-k layers attached on top of each other, each low-k layer to low-k layer interface offering a potential delamination problem.

Moreover, low-k materials offer poor resistance to compression. This is significant in packaging of dies. For example, once the integrated circuits on the wafer are completed, i.e., layering and patterning are implemented, the wafer is conventionally sliced into sections known as die. The die are conventionally packaged to facilitate electrical connections to external circuitry. Generally, in semiconductor manufacturing, an individual semiconductor die is mounted to a substrate and then sealed by an encapsulant or by a molding operation. After mounting, electrical connection from the die to the package bonding pads may be completed using wire bonding techniques, for example. Typically, after packaging, the packaged die is placed flat on the printed circuit board ("PCB") and electrical connections made to traces or landings on the printed circuit board, for example by wire bonding, solder ball bonding, or other conventional methods.

Any of these connection methods may place large stress forces on the substrate. For example, wire bonding requires that a large compressive force be placed on the bonding pad as heat is generated to "weld" the bonding wire to the pad. In using solder balls for connections to external circuitry, the ball bonding process window is directly related to the mechanical strength of the composite films that make up the bed and affects the ability to route circuitry under the ball bond pad. Often, however, the low-k layers underneath the bonding pad may comprise as may as 10 or more layers. The poor mechanical strength of the low-k material under the bonding pad thus may affect the ability to route circuitry under the ball bond pad. That is, interconnect circuitry placed under the bond pad may be damaged from the forces imposed during wire bonding, such as by crushing the underlying dielectric layers, or similarly damaged from other electrical connection methods. The poor mechanical properties of the low k film affect the overall reliability of the chip and the types of packages that can be used for the chip.

Accordingly, it is desirable to provide improved mechanical strength in low-k dielectric layers used in semiconductor devices so that greater flexibility may be achieved in locating bonding pads and forming electrical connections over the low-k dielectric layers and in order to form dies having greater strength.

SUMMARY OF THE INVENTION

To achieve the foregoing, the present invention provides methods and apparatus for forming semiconductor devices having low-k layers with improved mechanical strength. The process forms pillars or columns of hardened material in the low-k film. By using the hardened pillars distributed throughout the low k film, either according to a predetermined pattern or spaced in cognizance of wiring layer conductor locations, the mechanical strength of the low-k film is improved and the propagation of shear forces between layers is terminated.

In one embodiment, the present invention provides a semiconductor device structure having a low-k dielectric film with improved mechanical strength. A plurality of columns having increased hardness are formed in the low-k layer to increase the overall strength of the low-k layer.

The support columns are formed by reducing the low-k dielectric film in the plurality of locations by using an E-beam tool. The energy provided by the e-beam breaks the C—H bonds or increases the temperature to allow trapped molecules in the dielectric film to be reduced and released. That is, the energy from the E-beam chemically reduces the composition of the low-k film at the exposed locations to form a plurality of pillars (i.e., support columns) of increased hardness. The higher hardness is produced in the exposed areas due to the higher carbon composition in those areas. In another embodiment, the low-k film is strengthened by forming a plurality of holes using photolithography, etching, deposition, and CMP steps.

These and other features and advantages of the present invention are described below with reference to the drawings.

BRIEF DESCRIPTION OF THE DRAWINGS

FIGS. 1A–1D are diagrams illustrating various stages in the formation of vertical columns in low-k films in accordance with one embodiment of the present invention.

FIGS. 2C–2D are diagrams illustrating stages in forming support columns in low-k films in accordance with an alternative embodiment of the present invention.

DETAILED DESCRIPTION OF PREFERRED EMBODIMENTS

Figure 3A:
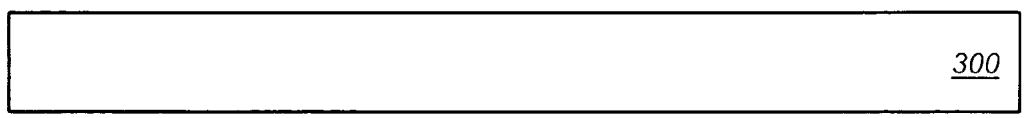
FIGS. 3A–3E are diagrams illustrating stages in forming support columns in low-k films in accordance with another embodiment of the present invention.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides an improved process and apparatus for providing low-k films in semiconductor devices. The low-k layers modified by the techniques of the present invention have improved mechanical strength. The process forms pillars or columns of hardened material in the low-k film. By using the hardened pillars distributed throughout the low k film, either according to a predetermined pattern or spaced in cognizance of wiring layer conductor locations, the mechanical strength of the low-k film is improved and the propagation of shear forces between layers is terminated.

FIGS. 1A–1D are diagrams illustrating various stages in the formation of vertical pillars in low-k films in accordance with one embodiment of the present invention. As described "vertical" refers to the fact that the columns extend in the direction from a first surface to a second surface of the dielectric layer. As a further example, deposited layers are described as having a top surface, i.e., the top surface being that portion of the layer last deposited. Using a similar nomenclature here, vertical refers to the direction of the columns as extending in the direction from a top surface of the dielectric to a bottom. As illustrated in FIG. 1A, the process commences with the deposition of a low-k film 100. Techniques for the deposition of low-k films are known to those of skill in the art and therefore further description is deemed unnecessary. Such methods include, for example, chemical vapor deposition, plasma enhanced chemical vapor deposition, and spin on techniques.

The prevalence of low-k films for interconnect dielectric has increased with the drive towards smaller devices. It should be understood that interconnect layers are typically stacked on semiconductor devices for providing power, ground, and signal lines. Especially with the trend towards miniaturization, copper has become the material of choice for the conductors in the interconnect layers. These materials are typically formed by damascene techniques. That is, a trench is patterned and etched in the dielectric and the copper conductor deposited to fill the trench. For the next interconnect layer, another dielectric layer is deposited on top of the foregoing layer and a similar damascene process step performed. Thus, the interconnect dielectric layer 100 shown in FIG. 1 should be understood as comprising any one of the multiple interconnect dielectric layers which may be formed on a substrate, whether formed directly on the active layer of the semiconductor device or disposed on top of one or more previously deposited interconnect dielectric layers.

FIG. 1B illustrates the formation of pillars (or columns) 102 in the low-k layer 100 in accordance with one embodiment of the present invention. Preferably, the locations for the pillars are exposed to an E-beam source, denoted by arrows 103. The E-beam source power and exposure time will depend upon the size and number of pillars 102, the thickness of the low-k interconnect dielectric layer 100, and the carbon composition of the low-k layer 100. A preferable range for the E-beam source is 1 to 2000 amperes/cm$^2$ for columns (pillars) 102 having a diameter of 0.02 to 0.5 micron. In a more preferable embodiment, an e-beam source of about 2 amperes/cm$^2$ is used to form pillars approximately 0.05 micron in diameter, the pillars distributed over the low-k layer with a 30% local density. As noted, the exposure times are process dependant. One skilled in the art having the guidance provided by this specification could determine an appropriate exposure time with minimal experimentation.

Due to the energy provided from the E-beam source, the pillar region is reduced in height from the height 108 of the low-k layer to a reduced height of the top surface 106 of the pillar 102. While not wishing to be bound by any theory, it is believed that low-k materials owe their reduced dielectric constant characteristics to the porosity in the layer. As a result of the exposure to the E-beam source, the porosity is reduced or eliminated, resulting in a portion of the low-k layer having an appreciably higher hardness value than the remainder of the unexposed low-k layer. For example, low-k materials will often bear hardness values in the range from 0.1 to 3 G Pa. Using the techniques of the present invention, those hardness values may be made to increase 10 to 12 times or more. As a consequence of the reduction in porosity in the pillar locations, the k value for the pillar is also increased. Thus balancing of the number and size of the pillars is necessary to achieve the desired mechanical strength without increasing the overall dielectric constant k of the low-k layer to undesirably high levels.

The exposure of the selected locations of the low-k film to an E-beam source reduces the low-k material at those locations to a carbon-silicon polymer in one embodiment. That is, it is believed that the focusing of the E-beam energy on the pillar locations in the low-k layer bleeds off the low molecular weight materials in the low-k. The polymeric composition of the pillars is dependant upon the composition of the low-k layer. For example, the low-k layer may be a carbon-hydrogen (C—H) compound or alternatively a silicon-hydrogen (Si—H) compound, resulting in respectively either a carbon or silicon pillar. Moreover, these compounds may be germanium (Ge) doped.

The material characteristics of the carbon-silicon polymer pillars 102 are process dependent. That is, the eventual hardness of the pillars 102 may be controlled through selection of the percentage of carbon hydrogen or C—H compound in the low-k film, the density of the low-k film, the energy of the E-beam and the E-beam exposure time. For example, a wide variety of low-k materials have been adopted, the variety offering a range for the carbon and pore size densities in the material. For example, methylsilsesquioxane ("MSQ") is one material suitable for use in low-k dielectric layers and can be made to have a carbon percentage of between 6 atomic percent to 60 atomic percent. Yet another suitable low-k material is nanoporous silica, having a carbon percentage of less than 2 atomic percent. Selecting a low-k material with higher carbon percentages is expected to result in the formation of pillars having increased hardness in comparison to those formed from low-k layers of lower carbon silicon composition, thus resulting in pillars having higher strength. In similar fashion, increased densities in low-k films are expected to result in potentially higher hardness values for the pillars 102. Further, higher energy for the E-beam directed to a pillar location and longer exposure times are expected to yield higher hardness values in the pillars 102.

As a result of the exposure to the E-beam source, shrinkage of the low-k film occurs in the exposed areas. This is shown by the cavity 110 directly above the pillars 102. The shrinkage of the low-k film in the areas exposed to the E-beam source will be affected by the same process parameters. That is, the density and percentage of carbon of the low-k film, and the E-beam energy and exposure time have a direct effect on the shrinkage of the low-k film. While not expected to occur in all cases, the reduction of the low-k material to a higher hardness pillar 102 may also result in some "mushrooming" or expansion of the diameters of the pillars 102 on the bottom surface of the low-k film, i.e., at the interface between the low-k film and the surface upon which it is deposited. While not wishing to be bound by any theory, it is believed that this expansion occurs due to either dispersion or reflected energy from the underlying surface or substrate. It will be appreciated therefore that the columns may vary in configuration from the top surface to the bottom surface of the pillar without departing from the spirit and scope of the present invention. That is, the pillars may have in some cases uniform widths when viewed in a cross section taken in a plane perpendicular to the top surface of the low-k layer and in other cases the width may vary from the top to the bottom of the pillar.

Preferably, the local density of the mechanical support pillars formed in the low-k lies in the range from 5 to 70%, with 30% more preferable. The pillars may vary in dimension, but preferably lie in the range of 0.02 to 0.5 micron, more preferably about 0.05 micron in diameter.

In a next step, as illustrated in FIG. 1C, chemical mechanical polishing ("CMP") is performed on the low-k film 100 to bring the top surface 108' of the low-k film back to the same height as the top of the pillars 102. CMP techniques are known to those of skill in the art and therefore will not be described further here. An initial thickness of the low-k film 100 must be selected to accommodate the removal of top portions of the low-k film in order to achieve a planarized top surface 108' of the low-k film with embedded pillars 102 extending to the planarized surface 108', the final low-k film having a thickness after planarization satisfactory for the subsequent formation of interconnect wiring deposits, such as by damascene techniques.

According to an alternative embodiment of the present invention, etching of the low-k film occurs to reduce the height of the low-k film 100 to the height of the top of the pillars 102. Preferably, the etchant chemical will have a high selectivity to the hardened material forming the pillars 102. That is, the etchant chemical will tend to etch the low-k layer while not etching or etching at a reduced rate the pillars 102. For example, selectivities exceeding 4:1 are believed to be suitable with a selectivity of 10:1 preferred, but the suitable range may be greater or smaller depending upon the initial low-k film thickness, the final low-k film thickness, and the hardness of the pillars 102. In a preferred embodiment, a plasma etch process using high oxygen content with fluoro containing compounds such as $CF_4$ or $NF_3$ is employed. In an alternative embodiment, the wet etch process may be a combination of an oxidizing chemical such as $HNO_3$ and HF, diluted using water. A dilution of HF of 100:1 concentration may also be used. Preferably, the cavity may be removed by plasma etching back the low-k layer using O2 to CF4 in a 5:1 ratio, a low power such as less than 500 watts and a low pressure of less than 100 mTorr. The preferred selectivity of the low-k material to the pillar material is 10:1.

Other etching techniques, for example dry plasma etching, may also be used, such as for example, by using Oxygen and $CF_4$ as process gases. Alternative process gases include cyanide forming compounds using $N_2$ or $NH_3$ with $CF_4$.

Next, as illustrated in FIG. 1D, inlay of copper vias 112 and interconnect wires 114 on the low-k film are formed in accordance with conventional techniques. For example, etching of the low-k film may be performed using damascene techniques. Such techniques may include, for example, dual or single damascene techniques for forming interconnect vias. Methods for forming inlaid conductors in low-k films are known to those of skill in the art and further description is deemed unnecessary. For example, the combination of the via 112 and interconnect wire 114 may be formed by alternative damascene techniques such as for example trench first or via first damascene methods. Although the embodiments have been descried with reference to the formation of interconnects using damascene processes, the invention is not so limited. For example, high temperature plasma etching of copper film or copper lift off processes are alternative methods of forming copper interconnects and the scope of the present invention is intended to extend to these and other interconnect forming techniques in low-k layers.

The positioning of the pillars 102 relative to the interconnect vias 112 and wires 114 is preferably controlled by an algorithm performing an OR operation with the interconnect vias 112 and wires 114 and forming the interconnect wiring level. That is, a periodic, i.e., repeating, pattern configured and suitably registered to a reference mark on the wafer is compared with the patterns defined for the interconnect wiring level. If a conductor such as vias 112 and wires 114 are already designated for that potential pillar position, the E-beam control program will be configured to avoid writing to those corresponding positions. Of course, the E-beam source can be modified further without departing from the scope of the present invention to turn off the E-beam source for those potential pillar positions that fall within a "buffer" zone defined as extending a predetermined distance from the wiring locations.

In an alternative embodiment, a photomask may be used to define the areas where the pillars are to be placed with a subsequent blanket E-beam exposure or deep uv exposure performed over the entire wafer. This alternative approach avoids the need for fine E-beam source control when forming the pillars 102.

In other alternative embodiments, the control of the E-beam exposure may be maintained in accordance with an algorithm that balances performance and mechanical stability. For example, where there are wide spaces between interconnect metal portions, the algorithm places a large number of supports. When the space between metal conductors is minimized, the number of supports will also be minimized. The overall mechanical strength of the low-k film wiring stacks will be controlled by the number, size, and density of the pillars 102. Thus, according to one embodiment of the present invention, the pillar pattern density is preferably varied across the surface of the die to provide support where needed or to limit dielectric modifications, for example, where circuit performance is critical. While embodiments of the invention have been described and illustrated with mechanical supports or pillars in a cylindrical shape, the invention is not limited to such shapes. Other geometric patterns, such as lines, for structural support may be formed either alone or in combination with pillars in accordance with alternative embodiments of the present invention.

FIG. 2C illustrates a process step for filling gaps created by the shrinkage of the low-k film material 100 in the pillar positions, in accordance with an alternative embodiment of the present invention. It should be understood that this is an alternative step to that depicted in FIG. 1C. That is, after performing the steps illustrated and described with reference to FIGS. 1A and 1B, an additional low-k film layer is deposited to form low-k film 100'. The additional low-k layer results in the composite low-k film filling the cavities 110 illustrated in FIG. 11B. Dimples 204 will typically be formed on the top surface of the deposited low-k film at the locations corresponding to the cavities shown in FIG. 1B.

Next, as illustrated in FIG. 2D, CMP polishing may be performed to polish the top surface 206 to remove dimples 204, thus leaving pillars embedded in the low-k film 100', the top surface of the pillars 102 still covered by the low-k film. Thus, mechanical strength can be improved and shear strength increased without exposing the pillars 102. Alternatively, the CMP step may be performed until the top surface of the pillars 102 are exposed. Pillar hardness and density may be used to control the CMP process. That is, changes in the polishing process as the pillars are reached can be sensed to determine the end of the polishing cycle. For example, a temperature increase in the wafer may be sensed or alternatively an increase in the friction generated causing a detectable increase in the power needed to rotate the wafer at the same rate can be sensed. The process illustrated in FIGS. 2C–2D then proceeds with the formation of the interconnect layers, as illustrated in FIG. 1D and described above.

Figure 3B:
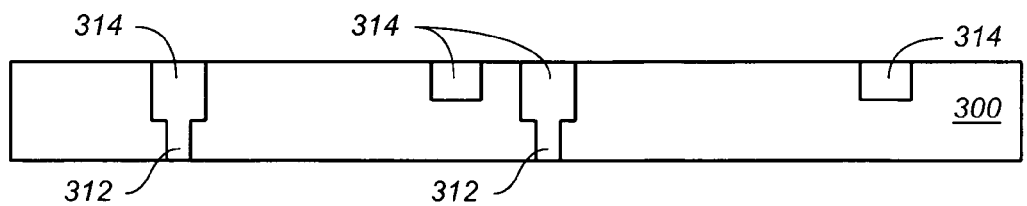
Figure 3C:
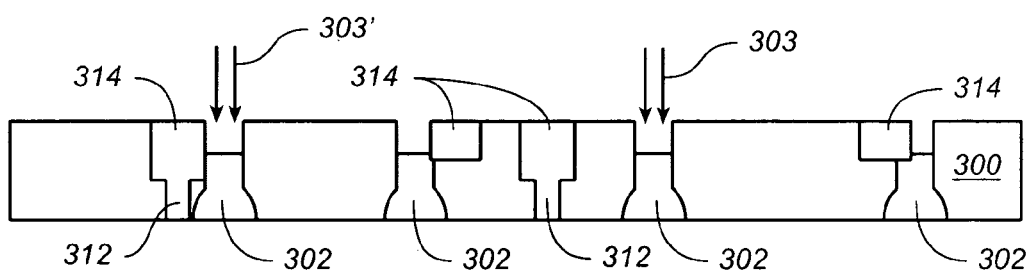

In an alternative embodiment, as further illustrated in FIGS. 3A–3C, the pillars are formed after placement of the metal interconnect layers. In accordance with this embodiment, the process commences as illustrated in FIG. 3A with the deposition of the low-k film 100 as described above with reference to FIG. 1A. Next, as illustrated in FIG. 3B, the vias 312 and interconnect wires 314 are formed in accordance with conventional techniques, such as, for example, copper damascene methods, all as further described above in referring to FIG. 1B.

Figure 3D:
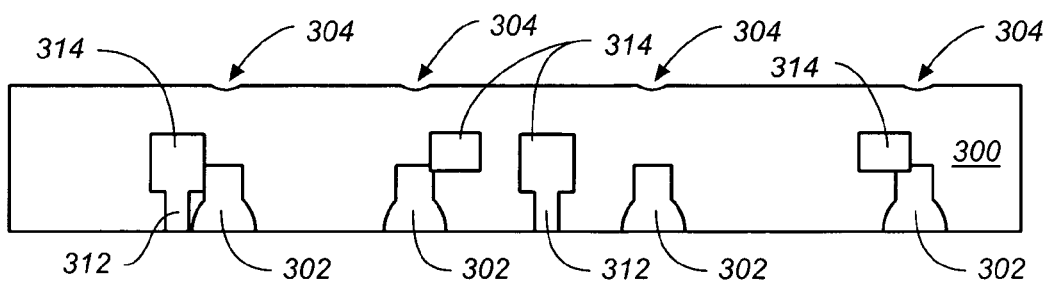

After placement of the metal interconnect layers (i.e., 312 and 314) the pillars are then formed by the methods described above with reference to FIGS. 1A–1D. FIG. 3C illustrates the formation of the pillars 302 by the E-beam methods described above. That is, E-beam exposure is used to produce the hardened pillars, the resulting hardness of the pillars 302 determined by the process parameters, e.g., the exposure time and power of the E-beam source and the carbon composition and density of the low-k film. FIG. 3C illustrates the E-beam exposure 303 of the pillars independent of the wiring placement. That is, positioning of the pillars 302 is performed according to a predetermined pattern without considering the locations for the vias 312 and interconnect wires 314. For example, the support pillars 302 may be positioned in a uniform or other repeating pattern. Next, as illustrated in FIG. 3D, a second low-k layer is deposited on the first, resulting in a thicker low-k layer 300, for further damascene processing. Additional interconnect dielectric layers are often deposited for the formation of additional metallization levels. It should be appreciated that pillars may be formed in any or all of these additional low-k layers without departing from the spirit and scope of the present invention.

Figure 3E:
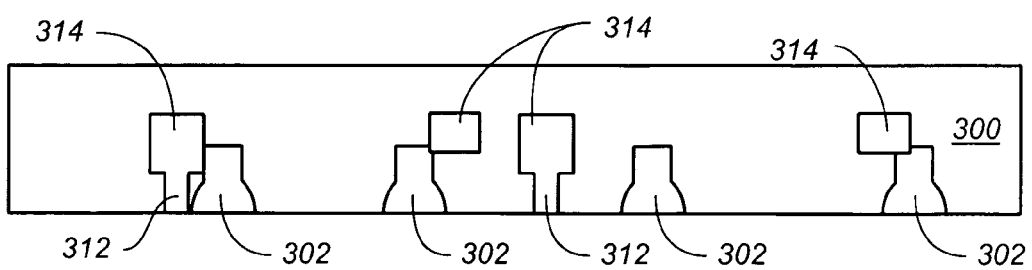

As illustrated in FIG. 3E, the dimples 304 are removed, preferably by CMP techniques, to result in a planarized surface 318. Additional interconnect dielectric layers may subsequently be deposited for forming further interconnect layers.

With this method, E-beam exposure of the entire pattern may occur independent of the wiring placement. That is, the pillars 302 may be positioned according to a predefined pattern irrespective of the wiring pattern. Thus, with the interconnect vias 312 and wires 314 already formed, such as through conventional damascene etch and fill techniques, the pillars may be placed by E-beam techniques without concern for potential damage to the interconnect vias 312 and wires 314 from the relatively low-powered E-beam exposures used to form the pillars. This avoids the problems which might occur in attempting to etch the trenches for the damascene technique in a location where a hardened pillar already had been formed. Although various embodiments and sequences of forming the pillars and interconnect wires have been described, and the scope of the invention is intended to embrace all such combinations and sequences, preferably, formation of the pillars and polishing back occurs prior to forming the interconnect wiring.

In yet another alternative embodiment, the plurality of pillars is formed by depositing pillars of hard dielectric materials to support the low-k material. Preferably, the dielectric pillar material will have a relatively low dielectric constant (k) value. Suitable materials for the deposited hard pillars include, but are not limited to silicon carbide, fluorinated silicate glass (FSG), or porous silicates. For another specific example, hydrogen silsesquioxane ("HSQ") is a suitable low-k material commercially available from Dow-Corning Corporation. A preferable material is silicon carbide.

In order to form the pillars in accordance with this embodiment, conventional photoresist patterning and etching are performed, followed by depositing of the pillar material by conventional methods, such as for example, chemical vapor deposition (CVD). Finally, CMP polishing is performed on the deposited layer to result in the low-k dielectric having a planarized top surface and pillars distributed in the predetermined pattern over the wafer surface. This technique, i.e., depositing pillar material by conventional methods such as CVD, may alternatively be used for filling in the cavities formed by shrinkage of the low-k film material 100 in the pillar positions caused by the e-beam exposure described with reference to FIG. 1.

Preferably, the coefficient of expansion of the low-k films and the material formed in the pillars is matched to minimize stress between the films. In one embodiment, an adherence promoting step is incorporated, where, for example, the cavity is filled with low-k materials. For example, where the polymer chains are terminated with $CH_x$ instead of OH, resulting in a reduced adherence, incorporation of an adherence promoting step is preferred. Plasma etch may be used in accordance with one embodiment to soft etch the surface to create dangling bonds or coating the surface with an organofunctional silane to provide a bonding agent using vinyl groups.

It should be recognized that selection of the pillar characteristics involves assessing competing considerations. For example, when using the E-beam exposure embodiment to form the pillars, the control of the exposure will involve an algorithm balancing performance and stability. Thus, where wide spaces exist between interconnect vias and wires, the algorithm will place a large number of supports; when the space is at a minimum distance the number of supports will be fewer. The resulting mechanical strength for the entire low-k film will be controlled by the density and size of the pillars. Since the dielectric constant of the pillars is higher than the surrounding low-k material, for optimization the number and size of the pillars should be minimized. Algorithms balancing these factors for optimization may be performed in one embodiment in software configured for execution by a processor, such as in a computer, a programmable chip, or even in a standalone integrated circuit.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method of forming a semiconductor integrated circuit having a strengthened low-k dielectric layer, the method comprising:
providing a substrate;
forming a low-k dielectric layer over the substrate, the low k-dielectric having a top surface;
forming a plurality of pillars in the low-k dielectric layer material by treating the low-k dielectric layer with an E-beam source, each of the plurality of pillars comprising a harder dielectric material than the low-k dielectric layer, wherein the e-beam treatment causes a top surface of at least one of the plurality of pillars to be recessed into the low-k dielectric layer; and
planarizing the top surface of the low-k dielectric layer such that the top surface of the dielectric layer is substantially coplanar with the top surfaces of the plurality of pillars.

2. The method of forming a semiconductor integrated circuit as recited in claim 1, wherein forming the low-k dielectric layer comprises forming the layer such that a bottom surface of the low-k dielectric layer is formed on the substrate and wherein each of the plurality of pillars extends from the top surface to the bottom surface of the low-k dielectric layer.

3. The method of forming a semiconductor integrated circuit as recited in claim 1 wherein the E-beam energy from the E-beam source is in the range from 1 to 2000 amperes/$cm^2$.

4. The method of forming a semiconductor integrated circuit as recited in claim 1 wherein the E-beam source is a direct writing E-beam source.

5. The method of forming a semiconductor integrated circuit as recited in claim 1 wherein forming a plurality of pillars by treating the low-k dielectric layer with an E-beam source comprises:

forming and patterning a photoresist layer on the low-k dielectric layer; and
performing a blanket E-beam exposure on the patterned photoresist layer to expose the locations of the plurality of pillars.

6. The method of forming a semiconductor integrated circuit as recited in claim 1 wherein the plurality of pillars range from 0.02 to 0.5 $\mu$m in width.

7. The method of forming a semiconductor integrated circuit as recited in claim 1 wherein the plurality of pillars range from 0.05 to 0.09 $\mu$m in diameter.

8. The method of forming a semiconductor integrated circuit as recited in claim 1 wherein each of the plurality of pillars comprises a carbon silicon polymer.

9. The method of forming a semiconductor integrated circuit as recited in claim 1 wherein the E-beam energy from the E-beam source is about 2 amperes/$cm^2$ and the pillar size is about 0.05 $\mu$m in width.

10. The method of forming a semiconductor integrated circuit as recited in claim 1 wherein the local pillar density is in the range from 5 to 70%.

11. The method of forming a semiconductor integrated circuit as recited in claim 1 wherein a predetermined pattern is used to determine the placement locations of the plurality of pillars across the die.

12. The method of forming a semiconductor integrated circuit as recited in claim 11 wherein the pattern is uniform across the die.

13. The method of forming a semiconductor integrated circuit as recited in claim 11 wherein the pattern is established so that the pillar pattern is not formed on locations having at least one of interconnect wires and vias.

14. The method of forming a semiconductor integrated circuit as recited in claim 1 wherein interconnect wires and vias are formed in the low-k dielectric layer prior to forming the plurality of pillars.

15. The method of forming a semiconductor integrated circuit as recited in claim 14 wherein the pillars are placed in a periodic pattern independent of the locations of the interconnect wires and vias in the low-k dielectric layer.

16. A method of forming a semiconductor integrated circuit having a strengthened low-k dielectric layer, the method comprising:
providing a substrate;
forming a low-k dielectric layer having a top surface; and
forming a plurality of recessed pillars in the low-k dielectric layer material by exposing a plurality of locations in the low-k dielectric layer to an E-beam source, such that each of the plurality of recessed pillars comprises a harder dielectric material than the low-k dielectric layer, wherein each of the plurality of recessed pillars extends from the top surface of the low-k dielectric to the underlying substrate.

17. The method of forming a semiconductor integrated circuit as recited in claim 16 further comprising forming another layer of low-k dielectric material over the recessed pillars and the top surface of the low-k dielectric layer wherein a top surface of the another layer includes dimples; and
further comprising planarizing the another layer to remove the dimples.

18. The method recited in claim 1 wherein the forming the plurality of pillars in the low-k dielectric layer material by treating the low-k dielectric layer with an E-beam source comprises forming at least some of the pillars such that a bottom portion of the pillar is wider that a top portion of the pillar.

19. The method of claim 1 wherein the forming of the low-k dielectric layer over the substrate comprises forming the low k-dielectric with a substantially planar top surface; and wherein forming the plurality of pillars in the low-k dielectric layer by treating the low-k dielectric layer with an E-beam source causes a top surface of at least one of the plurality of pillars to be recessed below the substantially planar top surface of the low-k dielectric layer.

20. The method of claim 1 wherein the forming the plurality of pillars by treating the low-k dielectric layer with an E-beam source results in pillars having a higher K value than the material of the low-k dielectric layer.

21. The method of forming a semiconductor integrated circuit as recited in claim 16 further comprising forming another layer of low-k dielectric material over top surfaces of the recessed pillars and the top surface of the low-k dielectric layer, the top surface of the another layer including dimples; and further comprising planarizing the top surface of the another layer such that the top surface of the another layer is substantially coplanar with the top surfaces of the plurality of pillars.

* * * * *